United States Patent [19]

Hori et al.

[11] Patent Number: 5,300,185
[45] Date of Patent: Apr. 5, 1994

[54] METHOD OF MANUFACTURING III-V GROUP COMPOUND SEMICONDUCTOR

[75] Inventors: Hisao Hori, Tokyo; Yoshito Kawakyu, Kawasaki; Hironori Ishikawa, Tokyo; Masao Mashita, Yokohama, all of Japan

[73] Assignee: Kabushiki Kaisha Toshiba, Kawasaki, Japan

[21] Appl. No.: 858,690

[22] Filed: Mar. 27, 1992

[30] Foreign Application Priority Data

Mar. 29, 1991 [JP] Japan ................. 3-122002
Apr. 5, 1991 [JP] Japan ................. 3-073270
May 7, 1991 [JP] Japan ................. 3-101156
Aug. 30, 1991 [JP] Japan ................. 3-219101

[51] Int. Cl.$^5$ ............................. C30B 25/02
[52] U.S. Cl. ................... 158/610; 156/614; 437/81; 437/126
[58] Field of Search ......... 156/610, 614; 437/126, 437/81; 556/19, 70, 74, 77; 568/7

[56] References Cited

U.S. PATENT DOCUMENTS

| | | | |
|---|---|---|---|
| 3,647,429 | 3/1972 | Goldman et al. | 556/74 |
| 4,720,560 | 1/1988 | Hui et al. | 556/70 |
| 4,734,514 | 3/1988 | Melas et al. | 568/8 |
| 5,003,092 | 3/1991 | Beachley | 556/19 |
| 5,079,184 | 1/1992 | Hatano et al. | 437/94 |
| 5,124,278 | 6/1992 | Bohling et al. | 156/610 |
| 5,149,853 | 9/1992 | Erdmann et al. | 556/19 |

FOREIGN PATENT DOCUMENTS 692290  8/1964  Canada ................. 556/70
0337304 10/1989  European Pat. Off. .

*Primary Examiner*—Robert Kunemund
*Attorney, Agent, or Firm*—Oblon, Spivak, McClelland, Maier & Neustadt

[57] ABSTRACT

Disclosed is a method of efficiently manufacturing a III-V group compound semiconductor that carbon mixing is reduced, wherein a compound represented by the formula (1) or (2) is used as a V group source:

Formula (1)

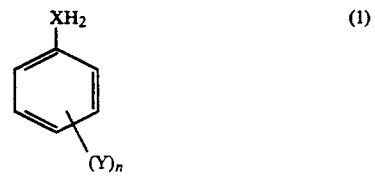

wherein X represents a V group element, n represents integer of 1 to 3, and Y represents electron-releasing group bonded to a position selected from 2-, 4-, and 6-positions,

Formula (2)

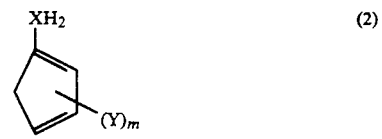

wherein X represents a V group element, m represents an integer of 1 or 2, and Y represents electron-releasing group bonded to a position selected from 2- and 4-positions.

8 Claims, 4 Drawing Sheets

METHOD OF MANUFACTURING III-V GROUP COMPOUND SEMICONDUCTOR

BACKGROUND OF THE INVENTION

1. Field of the Invention

The present invention relates to a method of growing a III-V group compound semiconductor on a substrate by an MOCVD method.

2. Description of the Related Art

In a conventional method of growing a compound semiconductor by a metal organic chemical vapor deposition method (MOCVD method) which is used for manufacturing a device such as a semiconductor laser and an LED, a V group hydride is used as a V group source, i.e., phosphine ($PH_3$) is used as a phosphorus source, and arsine ($AsH_3$) is used as an arsenic source. However, since these hydrides have very strong toxicity, high-cost peripheral equipment for such as an exhaust gas treatment is required for a safety operation. In addition, since these compounds are decomposed by only several percentages at a growth temperature of about 700° C. in a normal MOCVD method, the utilization efficiency of the compounds is very low. For this reason, a high-quality thin film cannot be obtained unless the V group compounds are used several hundreds times more than III group compounds.

To solve problems in safety and utilization efficiency, various V group sources are examined.

Trialkyl V group compounds such as trimethylphosphine or trimethylarsine and monoalkyl V group compounds such as tert-butylphosphine or tert-butylarsine are examined (Appl. Phys. Lett., 48, 1531 (1986)). However, when these compounds are used, organic radicals are generated by thermal decomposition, and carbon atoms are undesirably mixed in a film to be grown. Especially, when trialkylphosphine is used, it is difficult to cause phosphorus deposition (G. B. Stringfellow "Organometallic Vapor-Phase Epitaxy" Academic Press, (1989) p. 35).

Phenyl V group compounds such as phenylphosphine and phenylarsine in which a phenyl group is bonded to a V group element are also examined. Since phenylphosphine and phenylarsine are resonantly stabilized, they are promising alternative sources that are expected that the carbon mixing to the film is substantially slight. As examples of MOCVD method using phenylarsine, growth of InAs is described in J. Cryst. Growth, 97, 489 (1989), and growth of GaAs is described in Chemtronics, 4, 78 (1989). In these examples, films can be obtained having excellent electrical characteristics that can cope with those of films obtained by using hydrides.

The above phenyl V group compounds, however, have a drawback that their thermal decomposition temperature is not largely different from that of hydrides, so that the utilization efficiency is disadvantageously low. Since the vapor pressures of the phenyl V group compounds are about 1 Torr at most at room temperature, bubblers in which these compounds are stored and supply tubes must be heated. In addition, these compounds cause side reactions in which they form adducts together with III group sources such as trimethylgallium to produce nonvolatile polymers having no contribution to the film growth (for example, Chemtronics, 4, 78 (1989)). Such side reactions are not only disadvantageous to the growth of compound semiconductors having an excellent surface, but they cause to degrade utilization efficiency of the V group compounds. To improve utilization efficiency of the V group source and to realize the growth of a high-quality compound semiconductor having an excellent surface morphology, the above drawbacks must be eliminated by chemically modifying the V group compounds.

SUMMARY OF THE INVENTION

It is an object of the present invention to provide a method of manufacturing a high-quality III-V group compound semiconductor at high efficiency.

In a method of manufacturing a III-V group compound semiconductor according to the present invention, used as a V group source is a compound consisting of a V group element and an organic group bonded to the element, the organic group being selected from the group consisting of an aromatic hydrocarbon group and a cycloalkenyl group having a substituent for reducing a bond energy with the V group element.

In another method of manufacturing a III-V group compound semiconductor according to the present invention, used as a V group source is a V group hydride in which at least one hydrogen atom is substituted with a substituent selected from the group consisting of a monoalkylamino group and a dialkylamino group.

The V group sources used in the present invention are easily decomposed because the bond energy between the V group element and the organic group is low, so that a high utilization efficiency is obtained. In addition, since organic radicals generated by the decomposition of the V group sources are stable, an amount of carbon mixed in a film to be grown can be reduced.

Additional objects and advantages of the invention will be set forth in the description which follows, and in part will be obvious from the description, or may be learned by practice of the invention. The objects and advantages of the invention may be realized and obtained by means of the materials and combinations particularly pointed out in the appended claims.

DETAILED DESCRIPTION OF THE PREFERRED EMBODIMENTS

The present invention will be described in detail below.

There will be described a V group source consisting of a V group element and an organic group bonded to the element, wherein the organic group is selected from the group consisting of an aromatic hydrocarbon group and a cycloalkenyl group having a substituent for reducing a bond energy with the V group element. Examples of the V group element are phosphorous and arsenic. An example of the aromatic hydrocarbon group is a phenyl group. Examples of the cycloalkenyl group are a cyclopentadienyl group and a cyclohexenyl group.

As the V group source, a compound represented by the following formula (1) or (2) is preferably used.

Formula (1)

(1)

(wherein X represents a V group element, n represents an integer of 1 to 3, and Y represents an electron-releasing group bonded to a position selected from 2-, 4-, 6-positions.)

Formula (2)

(2)

wherein X represents a V group element, m represents an integer of 1 or 2, and Y represents an electron-releasing group bonded to a position selected from 2- and 4-positions.

As shown in the formula (1) or formula (2), the organic group to be bonded to the V group element is preferably a 5-membered ring or a 6-membered ring. Since a ring smaller than the 5-membered ring generates unstable organic radicals by thermal decomposition resulting in easily mixing carbon in a film to be grown, it is not preferably used. Since a ring larger than the 6-membered ring has a low vapor pressure, it is not preferably used for MOCVD.

In the formula (1), an electron-releasing group is preferably bonded to at least one position selected from the 2-, 4-, and 6-positions of a benzene ring. In the formula (2), an electron-releasing group is preferably bonded to at least one position selected from the 2- and 4-positions of a cyclopentadiene ring. Examples of the electron-releasing group are a non-substituted or alkyl-substituted amino group and halogen.

In the phenyl V group compound represented by the formula (1), since the electron-releasing group is bonded to at least on position selected from the 2-, 4-, and 6-positions, a bond energy between a phenyl group and a V group element is reduced, and the compound is easily thermally decomposed. In addition, when the electron-releasing group is bonded to at least one position selected from the 2- and 6-positions, the phenyl V group compound does not easily form an adduct together with a III group source due to steric hindrance. On the other hand, in a conventionally known V group source in which a non-substituted phenyl group is bonded to a V group element, since lone pair electrons of the V group element are shifted to a phenyl group to be resonantly stabilized, a bond energy between the V group element and the phenyl group is higher than that of $\sigma$-bond, and the V group source is not easily thermally decomposed. Therefore, thin film growth can be performed with higher efficiency by using the phenyl V group compounds represented by the formula (1) than by using a conventional phenyl compound. In addition, phenyl radicals generated by thermal decomposition are stable, thereby preventing carbon from mixing in a film to be grown.

In the 1,3-cyclopentadienyl V group compound represented by the formula (2), since the electron-releasing group is bonded to at least one position selected from the 2- and 4-positions, a bond energy between the cyclopentadienyl group and the V group element is reduced, and the compound is easily thermally decomposed. Further, a 5-membered ring is smaller in molecular size than a 6-membered ring, and hence has a smaller intermolecular force and a lower boiling point. Therefore, the vapor pressure of the compound at room temperature is raised, and the utilization efficiency of the compound is improved. In addition, since electrons in the 5-membered ring are resonantly stabilized, organic radicals generated by thermal decomposition are stable, thereby preventing carbon from mixing in a film to be grown.

The concept of the present invention can be applied to not only a method of growing a III-V group compound semiconductor, but a method of growing, for example, a II-VI group compound semiconductor. That is, if a VI group source is used consisting of a VI group element and an organic group bonded to the element that is selected from the group consisting of an aromatic hydrocarbon group and a cycloalkenyl group having a substituent for reducing bond energy with the VI group element, utilization efficiency can be improved, and the carbon mixing in the film to be grown can be prevented.

There will be described another V group source consisting of a V group hydride in which at least one hydrogen atom is substituted with a substituent selected from the group consisting of a monoalkylamino group and a dialkylamino group. This V group source is represented by the following formula (3).

Formula (3)

(3)

(wherein X represents a V group element, $R_1$ and $R_2$ each represent an alkyl group or a hydrogen atom, at least one of $R_1$ and $R_2$ being an alkyl group, and m represents an integer of 1 or 2.)

In this V group source, since the alkylamino group bonded to the V group element has an intense electron-releasing ability, the bond energy between the V group element and nitrogen atom is reduced. Therefore, the V group source is easily thermally decomposed. In addition, since the V group element is not bonded to carbon atom, organic radicals are not easily generated during the thermal decomposition. In this source, one or two hydrogen atoms are bonded to the V group element, which convert in hydrogen radicals during the thermal decomposition. Since the hydrogen radicals are reacted with organic radicals in the vapor phase, carbon mixing in the film is suppressed. Therefore, a film can be grown at high efficiency, and a high-quality thin film in which carbon is seldom mixed can be manufactured.

In the present invention, a source enabling to reduce carbon mixing in the film to be grown is preferably used as not only a V group source but a III group source. As a preferable III group source, an adduct of a III group hydride with an organic group coordinated to III group element. More specifically, trimethylaminegallane or the like is used. When such a III group source is used, hydrogen radicals are generated by thermal decomposition, and they promote the decomposition of the V group source as well as stabilize the generated organic radicals. For these reasons, a high-quality thin film in which carbon mixing is reduced can be grown.

The present invention can be applied to not only an MOCVD method but other methods. For example, the present invention can be applied to an atomic layer epitaxy (ALE) method. In the ALE method, a III group source and a V group source are alternately supplied to grow a crystal layer of III-V group compound semiconductor on a substrate while forming one atomic layer at a time. Since the growing temperature of the ALE method is lower than that of the normal MOCVD method, a large amount of carbon is disadvantageously mixed in the crystal layer. More particularly, when a compound semiconductor containing Al, e.g., AlAs or AlP, is grown, a carbon concentration in the crystal layer is increased, and surface morphology is degraded. To solve the above problems, an Al compound having a phenyl group bonded to Al or an Al compound having an amine coordinated to Al is preferably used. More specifically, phenylalane or trimethylaminealane is used.

The present invention can be applied to other methods such as an MOMBE method, a gas source MBE method, and a CBE method.

In the present invention, as a method of supplying sources, for example, a method of decomposing a V group source and supplying the decomposition product to a chamber for growing a film, or a method of supplying a III group hydride in addition to V group and III group sources may be used. In addition, a ratio of flow rate of the V group source to that of the III group source can be preferably set to be optimal.

EXAMPLES

Figure 1:
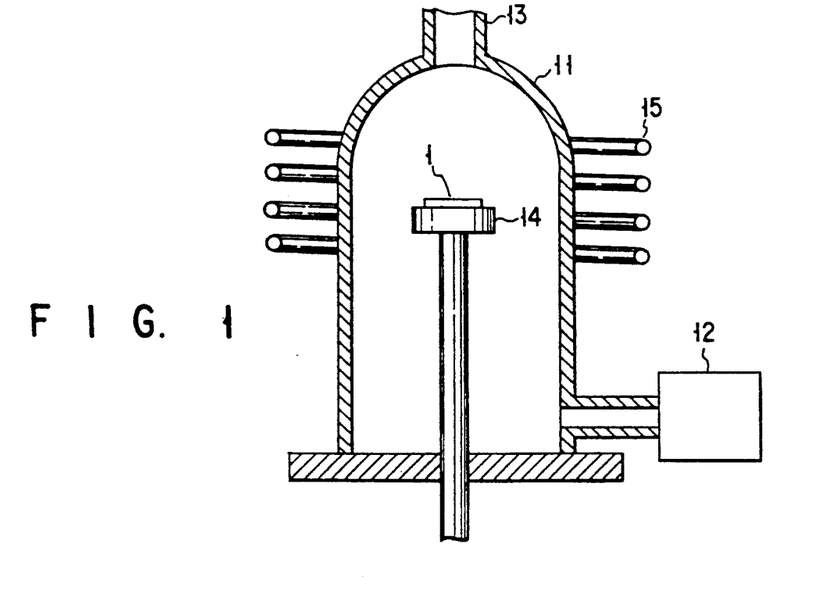
FIG. 1 is a sectional view showing an MOCVD apparatus used in the present invention.

In the following examples, a metal organic chemical vapor deposition (MOCVD) apparatus shown in FIG. 1 was mainly used. A chamber 11 provides an exhaust tube and a vacuum pump 12 connected to the exhaust tube at the lower portion, and a gas supply tube 13 at the upper portion. A susceptor 14 is arranged in the chamber 11, and a substrate 1 is mounted on the susceptor 14. An rf coil 15 for heating the substrate 1 is arranged around the outer periphery of the chamber 11.

The substrate 1 is pretreated with a mixed aqueous solution of sulfuric acid and hydrogen peroxide, and then mounted on the susceptor 14. The chamber 11 is evacuated by the vacuum pump 12 connected to the exhaust tube. The substrate 1 is heated by the rf coil 15 to be set to a predetermined temperature. Liquid sources are filled respectively in bubblers (not shown) where a carrier gas is supplied to evaporate each of source gases. As the carrier gas, hydrogen purified with palladium is generally used. A flow rate of each source gas is controlled by controlling temperature of the bubbler and a flow rate of hydrogen gas or by a mass-flow controller. The source gases are supplied to the chamber 11 from the gas supply tube 13 together with the carrier gas to be decomposed in the chamber 11. As a result, a predetermined compound semiconductor is grown on the substrate 1.

EXAMPLE 1

An example in which an InP thin film is grown by using 2-aminophenylphosphine represented by formula (4) as a V group source and trimethylindium as a III group source will be described below.

InP having a surface consisting of a (100) plane was used as a substrate. A power was applied to the rf coil to heat the substrate, and the substrate was kept at a temperature of 600° C. A hydrogen gas purified with Pd serving as a carrier gas was supplied to the bubblers in which 2-aminophosphine and trimethylindium were filled respectively to evaporate the source gases. The flow rate of each source gas is controlled by controlling the temperature of the bubblers and the hydrogen flow rate. The flow rates of 2-aminophosphine, trimethylindium, and the total gas were set respectively to 42 $\mu$mol/min, 2.1 $\mu$mol/min, and 2.0 l/min. These gases were supplied to the chamber, and the pressure in the chamber was kept to be 100 Torr to grow an InP thin film on the substrate. The growth rate of the InP thin film was 2.5 $\mu$m/h.

The surface of the resultant film was a mirror-like surface. According to a Hall effect measurement at a temperature of 30K, the conductivity type of this thin film was an n-type, and a residual carrier concentration was $7 \times 10^{14}$ cm$^{-3}$. Thus, a high-quality thin film could be obtained.

On the other hand, an InP thin film was grown using phenylphosphine in place of 2-aminophenylphosphine under the same conditions as described above. In this case, the growth rate of the thin film was ⅔ to that of the thin film obtained by using 2-aminophenylphosphine. In addition, innumerable hillocks were detected on the surface of the film. It was found from the above results that adduct formation was suppressed when 2-aminophenylphosphine was used.

EXAMPLE 2

An example in which a GaAs thin film is grown by using 2-aminophenylarsine represented by the formula (5) as a V group source and trimethylgallium as a III group source will be described below.

Formula (5)

GaAs having a surface consisting of a (100) plane was used as a substrate. The substrate was kept at a temperature of 650° C. The flow rates of 2-aminophenylphosphine, 2-aminophenylarsine, and a total gas were set respectively to 53 μmol/min, 2.1 μmol/min, and 2.0 l/min. The pressure in the chamber was kept to be 100 Torr to grow a GaAs film on the substrate.

The surface of the resultant film wa a mirror-like surface. According to a Hall effect measurement at a temperature of 300K, the conductivity type of this thin film was an n-type, and a residual carrier concentration was $10^{15}$ cm$^{-3}$ or less. Thus, a high-quality thin film could be obtained.

EXAMPLE 3

The concept of the present invention can be applied to not only a III-V group compound semiconductor but a II-VI group compound semiconductor. An example in which a ZnSe thin film is grown by using 2-aminophenylselenium represented by the formula (6) as a VI group source and dimethylzinc as a II group source will be described below.

Formula (6)

GaAs having a surface consisting of a (100) plane was used as a substrate. The substrate was kept at a temperature of 500° C. The flow rates of 2-aminophenylselenium, dimethylzinc, and a total gas were set respectively to 210 μmol/min, 2.1 μmol/min, and 2.0 l/min. The pressure in the chamber was kept to be 100 Torr to grow ZnSe film on the substrate.

The surface of the resultant film was a mirror-like surface. Strong free extcion emission was observed in a photoluminescence (PL) spectrum at a temperature of 4.2K.

EXAMPLE 4

An example in which an InP thin film is grown by using 2-amino-1,3-cyclopentadienylphosphine represented by the formula (7) as a V group source and trimethylindium as a III group source will be described below.

Formula (7)

InP having a surface consisting of a (100) plane was used as a substrate. The flow rates of 2-amino-1,3-cyclopentadienylphosphine, trimethylindium, and a total gas were set respectively to 20 μmol/min, 2.0 μmol/min, and 2.0 l/min. The pressure in the chamber was kept to be 100 Torr to grow an InP thin film on the substrate.

The surface of the resultant film was a mirror-like surface. According to a Hall effect measurement at a temperature of 300K, the conductivity type of this thin film was an n-type, and a residual carrier concentration was 1'$10^{15}$ cm$^{-3}$ or less.

EXAMPLE 5

In Example 4, a compound consisting of a V group element and a substituted cyclopentadienyl ring bonded to the element was used. However, as described in Examples 5 and 6, even when a compound consisting of the V group element and a non-substituted cyclopentadienyl ring bonded to the element was used, a high-quality III-V group compound semiconductor can be manufactured.

An example in which a GaAs thin film is grown by using 1,3-cyclopentadienylarsine represented by the formula (8) as a V group source and triethylgallium as a III group source will be described below.

Formula (8)

GaAs having a surface consisting of a (100) plane was used as a substrate. The substrate was kept at a temperature of 600° C. A hydrogen gas purified with Pd serving as a carrier gas was supplied to the bubblers in which 1,3-cyclopentadienylarsine and triethylgallium were filled respectively to evaporate the source gases and supply them to the chamber. The flow rate of each source gas was controlled by a mass-flow controller. The flow rates of 1,3-cyclopentadienylarsine and triethylgallium were set respectively to 20 μmol/min and 1 mol/min. The pressure in the chamber was kept to be 100 Torr to grow a GaAs thin film on the substrate.

The surface of the resultant film was a mirror-like surface. According to a Hall effect measurement at room temperature, the conductivity type of this thin film was an n-type, and a residual carrier concentration was $1 \times 10^{15}$ cm$^{-3}$ or less. According to an SIMS (secondary-ion mass spectrometry) analysis, the carbon concentration in the film was $10^{16}$ cm$^{-3}$ (detection limit) or less.

EXAMPLE 6

An example in which an InP thin film is grown by using 1,3-cyclopentadienylphosphine represented by the formula (9) as a V group source and trimethylindium as a III group source will be described below.

Formula (9)

InP having a surface consisting of a (100) plane was used as a substrate. The substrate was kept at a temperature of 580° C. A hydrogen gas purified with Pd serving as a carrier gas was supplied to the bubblers in which 1,3-cyclopentadienylphosphine and trimethylindium were filled respectively to evaporate the source gases and supply them to the chamber. The flow rate of each source gas was controlled by a mass-flow controller. The flow rates of 1,3-cyclopentadienylphosphine and trimethylindium were set respectively to 20 µmol/min and 1 µmol/min. The pressure in the chamber was kept to be 100 Torr to grow an InP thin film on the substrate.

The surface of the resultant film was a mirror-like surface. According to a Hall effect measurement at room temperature, the conductivity type of this thin film was an n-type, and a residual carrier concentration was $1 \times 10^{15}$ cm$^{-3}$ or less. According to an SIMS analysis, the carbon concentration in the film was $10^{16}$ cm$^{-3}$ (detection limit) or less.

EXAMPLE 7

An example in which an InP thin film is grown by using dimethylaminophosphine represented by the formula (10) as a V group source and trimethylindium as a III group source will be described below.

InP having a surface consisting of a (100) plane was used as a substrate. The substrate was kept at a temperature of 580° C. A hydrogen gas purified with Pd serving as a carrier gas was supplied to the bubblers in which dimethylaminophosphine and trimethylindium were filled respectively to evaporate the source gases. The flow rate of each source gas was controlled by controlling the temperature of the bubbler and the flow rate of the carrier gas. The flow rates of dimethylaminophosphine, trimethylindium, and a total gas were set respectively to 50 mol/min 1 mol/min, and 2.0 l/min. These gases were supplied to the chamber, and the pressure in the chamber was kept to be 100 Torr to grow a InP thin film on the substrate.

The surface of the resultant film was a mirror-like surface. According to a Hall effect measurement at a temperature of 300K, the conductivity type of this thin film was an n-type, and a residual carrier concentration was $1 \times 10^{15}$ cm$^{-3}$ or less. According to an SIMS analysis, the carbon concentration in the film was $10^{16}$ cm$^{-3}$ (detection limit) or less. Thus, a high-quality film could be obtained.

For comparison, an InP film was grown using phosphine in place of dimethylaminophosphine. In this case, unless the flow rate of phosphine was set to be 300 µmol/min or more, a film having a mirror-like surface could not be obtained. According to the above result, it was found that a thin film could be grown more efficiently by using dimethylaminophosphine than by using phosphine.

EXAMPLE 8

An example in which an InP thin film is grown by using bis(dimethylamino)phosphine represented by the formula (11) as a V group source and trimethylindium as a III group source will be described below.

InP having a surface consisting of a (100) plane was used as a substrate. The substrate was kept at a temperature of 600° C. A hydrogen gas purified with Pd serving as a carrier gas was supplied to the bubblers in which bis(dimethylamino)phosphine and trimethylindium were filled respectively to evaporate the source gases. The flow rate of each source gas was controlled by controlling the temperature of the bubbler and the flow rate of the carrier gas. The flow rates of bis(dimethylamino)phosphine, trimethylindium, and a total gas were set respectively to 40 µmol/min, 1 µmol/min, and 1.8 l/min. These gases were supplied to the chamber, and the pressure in the chamber was kept to be 100 Torr to grow an InP thin film on the substrate.

According to a Hall effect measurement at a temperature of 300K, the conductivity type of this thin film was an n-type, and a residual carrier concentration was $1 \times 10^{15}$ cm$^{-3}$ or less. According to an SIMS analysis, the carbon concentration in the film was $10^{16}$ cm$^{-3}$ (detection limit) or less. Thus, a high-quality film could be obtained.

EXAMPLE 9

An example in which a GaAs thin film is grown by using dimethylaminoarsine represented by the formula (12) as a V group source and trimethylgallium as a III group source will be described below.

GaAs having a surface consisting of a (100) plane was used as a substrate. The substrate was kept at a temperature of 650° C. A hydrogen gas purified with Pd serving as a carrier gas was supplied to the bubblers in which dimethylaminoarsine and trimethylgallium were filled respectively to evaporate the source gases. The flow rate of each source gas was controlled by controlling the temperature of the bubbler and the flow rate of the carrier gas. The flow rates of dimethylaminoarsine, trimethylgallium, and a total gas were set respectively to 50 µmol/min, 1 µmol/min, and 2.0 l/min. These gases were supplied to the chamber, and the pressure in the chamber was kept to be 100 Torr to grow a GaAs thin film on the substrate.

The surface of the resultant film was a mirror surface. According to a Hall effect measurement at a temperature of 300K, the conductivity type of this thin film was an n-type, and a residual carrier concentration was $1 \times 10^{15}$ cm$^{-3}$ or less. According to an SIMS analysis, the carbon concentration was $10^{16}$ cm$^{-3}$ (detection limit) or less. Thus, a high-quality film could be obtained.

EXAMPLE 10

In Examples 1 to 9 described above, III-V group compound semiconductors were grown using preferable V group sources. Note that, it is preferable to use a III group source that can reduce residual carbon in a film to be grown.

An example in which a GaAs thin film is grown by using trimethylaminegallane (TMAG) represented by the formula (13) as a III group source and trimethylarsine (TMAs) as a V group source will be described below.

Formula (13)

Semi-insulating GaAs having a surface consisting of a (100) plane was used as a substrate. After the substrate was mounted on a susceptor, a chamber was kept at a pressure of 20 Torr by operating the vaccume pump. TMAs was supplied to the chamber at a flow rate of 100 $\mu$mol/min, and the substrate was heated by an rf coil to a temperature of 700° C., and the substrate surface was treated for 20 min. After the substrate temperature was reduced to 600° C., TMAs and TMAG were supplied to the chamber at a flow rates of 100 $\mu$mol/min and 2 $\mu$mol/min, respectively, thereby growing a GaAs film on the substrate.

The resultant GaAs crystal layer was evaluated by a PL measurement at a temperature of 4.2K and a Hall effect measurement. According to the PL measurement, no peak attributed to carbon was observed. According to the Hall effect measurement, the conductivity type of this film was an n-type, and a residual carrier concentration was $1 \times 10^{15}$ cm$^{-3}$ or less at room temperature, and mobility at a temperature of 77K was 85,000 cm$^2$/V.sec or more.

For comparison, a GaAs crystal layer was grown using trimethylgallium (TMG) in place of TMAG. The resultant GaAs crystal layer was evaluated by a PL measurement at a temperature of 4.2K and a Hall effect measurement. According to the PL measurement, a peak attributed to carbon was observed. According to the Hall effect measurement, the conductivity type of this film was a p-type, and a residual carrier concentration was $5 \times 10^{17}$ cm$^{-3}$ at room temperature.

EXAMPLE 11

An example in which a GaAs thin film is grown by using 4-aminophenylarsine as a V group source and trimethylaminegallane as a III group source will be described below.

GaAs having a surface consisting of a (100) plane was used as a substrate. The flow rates of 4-aminophenylarsine, trimethylaminegallane, and a total gas were set respectively to 40 $\mu$mol/min, 2.0 $\mu$mol/min, and 2.0 l/min. These gases were supplied to the chamber, and the pressure in the chamber was kept to be 100 Torr to grow a GaAs thin film on the substrate.

The surface of the resultant film was a mirror-like surface. According to a Hall effect measurement, the conductivity type of this thin film was an n-type, and a residual carrier concentration was $1 \times 10^{15}$ cm$^{-3}$ or less. According to an SIMS analysis, the carbon concentration in the film was $10^{16}$ cm$^{-3}$ (detection limit) or less. Thus, a high-quality crystal could be obtained.

EXAMPLE 12

The present invention can be applied to ALE (Atomic Layer Epitaxy). The ALE is a method performed as follows. A III group source and a V group source are alternately supplied to grow III-V group compound semiconductor crystal layers by forming one atomic layer at a time. Since the thickness of the crystal layer can be accurately controlled on the order of atomic layer according to this method, the method is used for developing, e.g., a new functional element having a quantum wall structure or a superlattice structure.

Since a growing temperature in the ALE is lower than that in a normal MOCVD method, a large amount of carbon is disadvantageously mixed in a crystal layer. More particularly, when a compound semiconductor containing Al such as AlAs or AlP is grown using trimethylaluminum as an Al source, a carbon concentration in the crystal layer is $10^{19}$ cm$^{-3}$ or more, and the surface morphology is undesirably degraded. Examples using preferable Al sources will be described as Examples 12 to 14.

An example in which an AlAs layer is grown by a method of alternately supplying 4-aminophenylarsine as an As source and phenylalane ($C_6H_7Al$) represented by the formula (14) as an Al source will be described below.

Formula (14)

GaAs having a surface consisting of a (100) plane was used as a substrate and was mounted on the susceptor. After 4-aminophenylarsine and hydrogen were supplied to the chamber, the substrate was heated to a temperature of 750° C. by an rf coil, and the surface of the GaAs substrate was treated for 20 min. At this time, a total gas pressure was set to be 50 Torr, and the partial pressure of 4-aminophenylarsine was set to be 1 Torr. After the substrate temperature was reduced to 500° C., a total gas flow rate was set to be 3.5 l/min, and a pressure in the chamber was set to be 10 Torr. In this state, a cycle consisting of supplying 30 $\mu$mol of 4-aminophenylarsine for 5 seconds, substituting the 4-aminophenylarsine with hydrogen for 2 seconds, supplying 3.7 $\mu$mol of phenylalane for 5 seconds, and substituting phenylalane with hydrogen for 2 seconds was repeated 2,000 times.

The thickness of the layer grown for one cycle was about 0.283 nm, and it was confirmed that a monomolecular layer was grown for one cycle. According to an SIMS analysis, the carbon concentration in the layer was $10^{16}$ cm$^{-3}$ (detection limit) or less. Thus, a high-purity crystal could be obtained.

EXAMPLE 13

An example in which an AlAs layer is grown by a method of alternately supplying phenylalane ($C_6H_7Al$) as an Al source and arsine ($AsH_3$) as an As source will be described below.

GaAs was used as a substrate. After AsH$_3$ and hydrogen were supplied to the chamber, the substrate was heated to a temperature of 750° C. by an rf coil, and the surface of the GaAs substrate was treated for 20 min. At this time, a total gas pressure was set to be 50 Torr, and the partial pressure of AsH$_3$ was set to be 2 Torr. After the substrate temperature was reduced to 500° C., a total gas flow rate was set to be 3.5 l/min, and a pressure in the chamber was set to be 10 Torr. In this state, a cycle consisting of supplying 75 μmol of AsH$_3$ for 5 seconds, substituting the AsH$_3$ with hydrogen for 2 seconds, supplying 7 μmol of phenylalane for 5 seconds, and substituting phenylalane with hydrogen for 2 seconds was repeated 2,000 times.

The thickness of the layer grown for one cycle was about 0.283 nm, and it was confirmed that a monomolecular layer was grown for one cycle. According to an SIMS analysis, the carbon concentration in the layer was $10^{15}$ cm$^{-3}$ (detection limit) or less. Thus, a high-purity crystal could be obtained.

EXAMPLE 14

An example in which an AlAs layer is grown by a method of alternately supplying trimethylaminealane (TMAA) represented by the formula (15) as an Al source and arsine as an As source will be described below.

Formula (15)

As in Example 13, the surface of the GaAs substrate was treated. The substrate temperature was reduced to 500° C., a total gas flow rate was set to be 3.5 l/min, and the pressure in the chamber was set to be 10 Torr. In this state, a cycle consisting of supplying 75 μmol of AsH$_3$ for 5 seconds, substituting AsH$_3$ with hydrogen for 2 seconds, supplying 1.5 μmol of TMAA for 7 seconds, and substituting TMAA with hydrogen for 2 seconds was repeated 2,000 times.

The thickness of the layer grown for one cycle was about 0.283 nm, and it was confirmed that a monomolecular layer was grown for one cycle. According to an SIMS analysis, the carbon concentration in the layer was $10^{15}$ cm$^{-3}$ (detection limit) or less. Thus, a high-purity crystal could be obtained.

Note that, as a method of manufacturing a high-quality III-V group compound semiconductor thin film, in addition to the methods described in the above examples, the following various methods are available.

EXAMPLE 15

In a conventional technique, the following attempt was made (Applied Organometallic Chemistry, 3, 151 (1989)). That is, when a GaAs layer was to be grown using an organic V group source, ammonia (NH3) was supplied together with the source gases to trap alkyl radicals generated from the organic V group source, thereby suppressing carbon mixing. However, even when ammonia is used, a peak attributed to carbon is observed in a PL spectrum, and a large amount of carbon is still mixed.

In Example 15, a GaAs layer is grown using a III group hydride (diborane) in addition to a V group source (triethylarsine: TEAs) and a III group source (trimethylgallium: TMG).

Semi-insulating GaAs having a surface consisting of a (100) plane was used as a substrate. A pressure in a chamber was kept to be 20 Torr by operating the vacuum pump. TEAs was supplied to the chamber at a flow rate of 80 μmol/min, the substrate was heated to a temperature of 700° C. by an rf coil, and the surface of the substrate was treated for 20 min. After the substrate temperature was reduced to 600° C., the flow rates of TEAs, TMG, and diborane were set to be 80 μmol/min, 2 μmol/min, and 4 μmol/min, respectively to grow a GaAs film.

The resultant GaAs crystal layer was evaluated by a PL measurement at 4.2K and a Hall effect measurement. According to the PL measurement, no peak attributed to carbon was observed. According to the Hall effect measurement, the conductivity type of this layer was an n-type, and the carrier concentration was $1 \times 10^{15}$ cm$^{-3}$ or less at room temperature, and mobility at a temperature of 77K was 85,000 cm$^2$/V.sec or more. When the boron concentration in the resultant GaAs crystal layer was evaluated by an SIMS analysis to be $10^{15}$ cm$^{-3}$ (detection limit) or less.

According to this method, a high-quality thin film that carbon mixing is reduced can be grown because hydrogen radicals generated by decomposition of the III group hydride not only promote decomposition of the V group source but stabilize generated organic radicals. Note that the V group source and the III group source may be alternately supplied.

For comparison, a GaAs crystal layer was grown following the same procedures as described above except that diborane gas was not used. The resultant GaAs crystal layer was evaluated by a PL measurement at 4.2K, and a Hall effect measurement. In the PL measurement, a peak attributed to carbon was observed. In addition, according to the Hall effect measurement, the conductivity type of the layer was a p-type and a carrier concentration was $2 \times 10^{15}$ cm$^{-3}$ at room temperature.

EXAMPLE 16

A method of decomposing a V group source and supplying the decomposition product to the chamber will be described in Examples 16 and 17.

Figure 2:
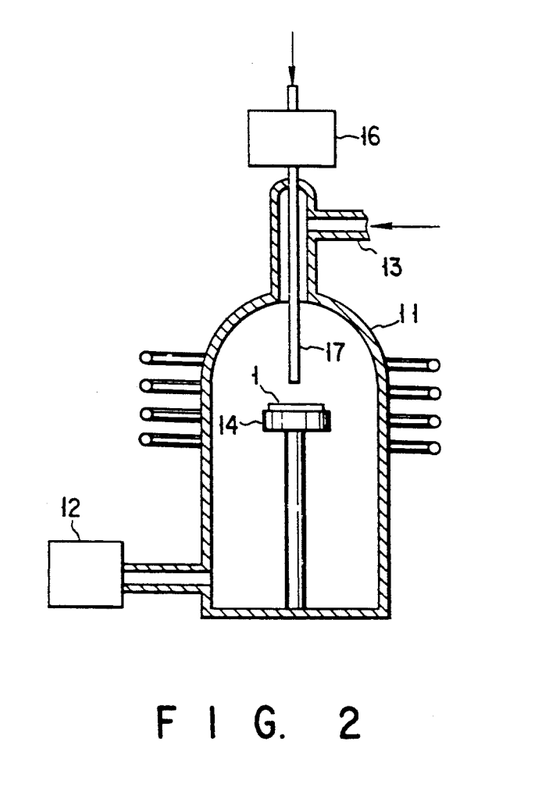
FIG. 2 is a sectional view showing an MOCVD apparatus having a thermal decomposition cell and used in the present invention.

An apparatus used in this method will be described below with reference to FIG. 2. This apparatus has the same arrangement as that of the apparatus in FIG. 1 except that a thermal decomposition cell 16 for decomposing a V group source and a gas supply tube 17 for supplying the decomposition product to the surface of the substrate 1 are arranged in the upper portion of a chamber 11.

Figure 3:
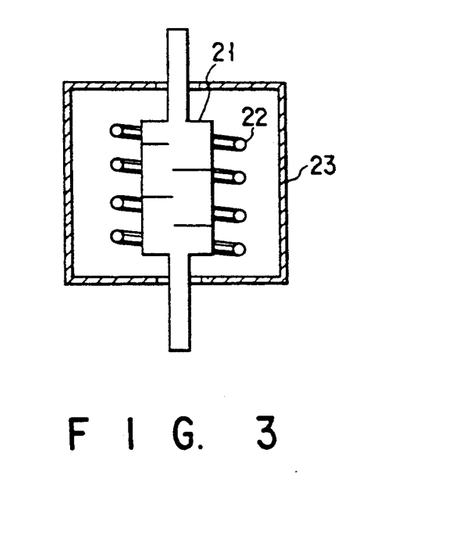
FIG. 3 is a sectional view showing a thermal decomposition cell.

As shown in FIG. 3, the thermal decomposition cell 16 has a structure in which a tungsten thermal decomposition furnace 21 is arranged in a thermal shield 23 and a heater 22 is arranged around the decomposition furnace 21.

An example in which a GaAs layer is grown using trimethylarsine (CH$_3$)$_3$As as a V group source and trimethylgallium (CH$_3$)$_3$Ga as a III group source will be described below. Trimethylarsine (CH$_3$)$_3$As was decomposed in the thermal decomposition cell 16 and supplied to the substrate 1 by the gas supply tube 17, and trimethylgallium (CH$_3$)$_3$Ga was supplied to the chamber 11 by a gas supply tube 13. Trimethylarsine and trimethylgallium were reacted with each other to grow a GaAs layer on the substrate 1.

The temperature in the thermal decomposition furnace was set to be 800° C. The flow rates of $(CH_3)_3Ga$ and $(CH_3)_3As$ were set to be 1 sccm and 50 sccm, respectively, the flow rate of hydrogen serving as a carrier gas was set to be 600 sccm, and the pressure in the chamber was kept to be 10 Torr. The growth rate of the GaAs layer was 2 μm/hour. The carrier concentration in the layer was $10^{15}/cm^3$. Thus, a high-purity layer could be obtained.

On the other hand, when a thermal decomposition furnace was not used, a p-type GaAs layer could be obtained, and a carrier concentration was $10^{17}/cm^3$.

Note that the V group source may be decomposed by light or a discharge plasma.

Figure 4:
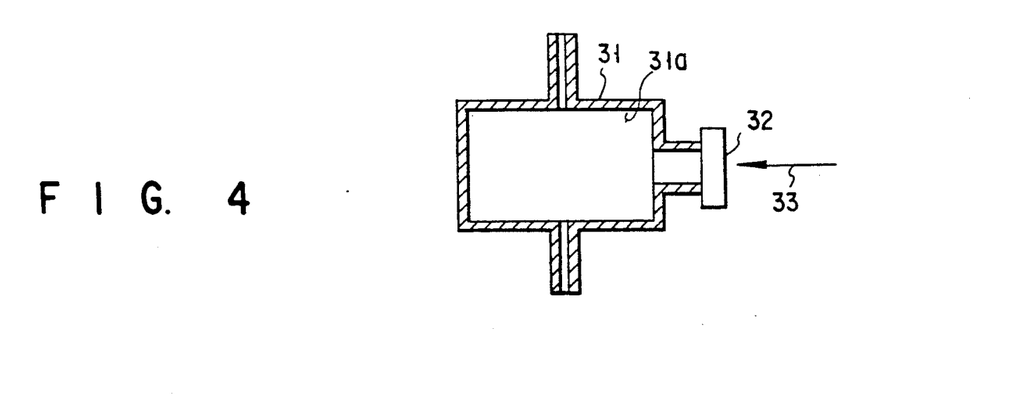
FIG. 4 is a sectional view showing a photolytic decomposition cell.

A photolytic decomposition cell is shown in FIG. 4. A synthetic-quartz window 32 is arranged on the side portion of a stainless vessel 31 whose inner wall is polished to have a mirror surface, and an ArF excimer laser beam 33 (wavelength of 193 nm) is supplied from the window 32. The V group source absorbs the laser beam to be decomposed. An inner surface 31a of the vessel 31 is polished into a mirror surface, so that the laser beam is reflected and enclosed in the vessel 31 to be effectively used.

Figure 5:
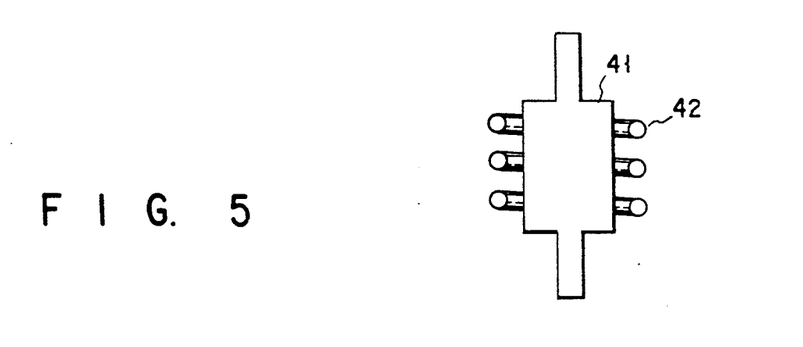
FIG. 5 is a sectional view showing a discharge plasma decomposition cell.

A plasma decomposition cell is shown in FIG. 5. A coil 42 for generating a plasma is arranged around a synthetic-quartz vessel 41.

EXAMPLE 17

An example in which an AlAs layer is grown by a method of alternately supplying trimethylaminealane (TMAA) as an Al source and trimethylarsine (TMAs) as an As source will be described below.

Figure 6:
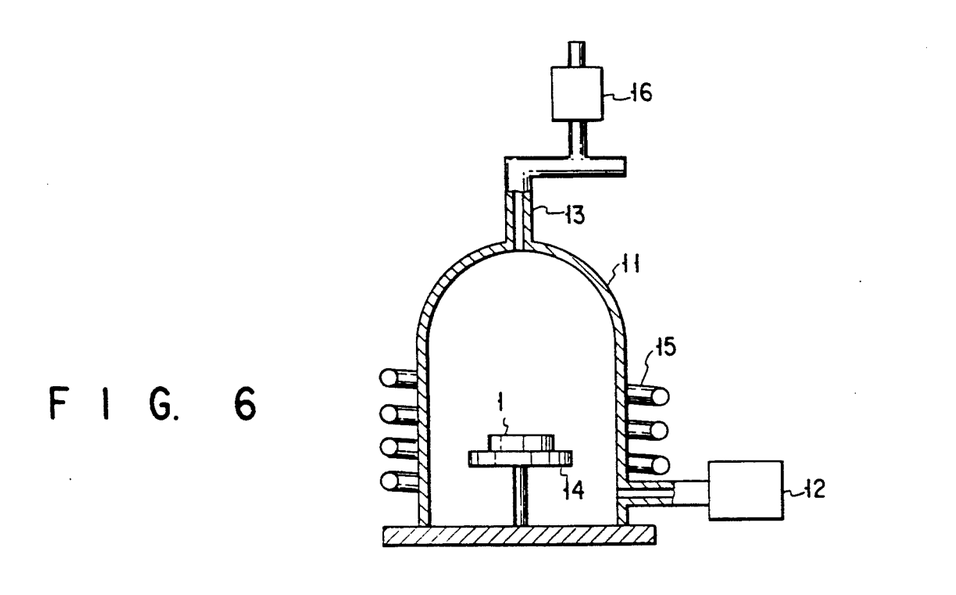
FIG. 6 is a sectional view showing another MOCVD apparatus having a thermal decomposition cell and used in the present invention.

An apparatus using in Example 17 is shown in FIG. 6. This apparatus has the same arrangement as that f the apparatus shown in FIG. 1 except that a thermal decomposition cell 16 is connected to a gas supply tube 13. A mixture gas of $AsH_3$ and hydrogen or a mixture gas of TMAA and hydrogen is supplied from the gas supply tube 13 to the chamber 11. A mixture gas of TMAs and hydrogen is supplied from the gas supply tube 13 to the chamber 11 through the thermal decomposition cell 16.

GaAs was used as a substrate, and the surface of the substrate was treated following the same procedures as in Example 12. The temperature of the thermal decomposition cell was set to be 700° C. After the substrate temperature was reduced to 500° C., a total gas flow rate was set to be 3.5 l/min, and the pressure in the chamber was set to be 10 Torr. A cycle consisting of supplying 75 μmol of TMAs, substituting TMAs with hydrogen for 2 seconds, supplying 1.5 μmol of TMAA for 7 seconds, and substituting TMAA with hydrogen for 2 seconds was repeated 2,000 times.

The thickness of the layer grown for one cycle was about 0.283 nm, and it was confirmed that an AlAs monomolecular layer was grown for one cycle. According to an SIMS analysis, the carbon concentration in the layer was $10^{15}$ cm$^{-3}$ (detection limit) or less. Thus, a high-purity crystal could be obtained.

EXAMPLE 18

In Example 18, results obtained by examining a flow rate ratio of a V group source to a III group source for obtaining a high-quality p- or n-type compound semiconductor crystal will be described.

Figure 7:
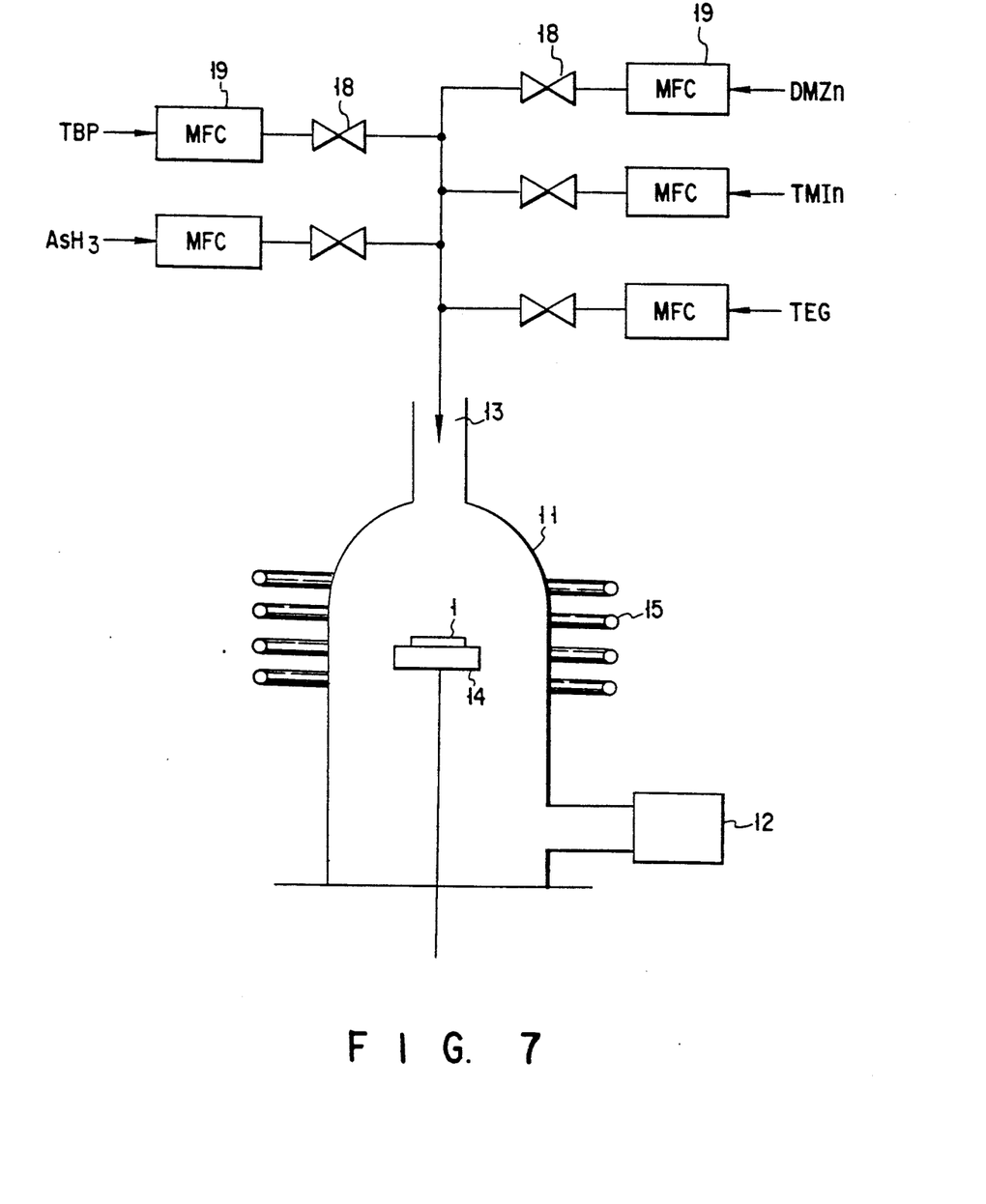
FIG. 7 is a sectional view showing still another MOCVD apparatus used in the present invention.

An apparatus used in Example 18 is shown in FIG. 7. This apparatus has the same arrangement as that of the apparatus shown in FIG. 1. In Example 18, a Zn-doped p-type InGaP crystal layer having a crystal lattice matched with GaAs is grown on a GaAs substrate. Trimethylindium (TMIn), triethylgallium (TEG), tert-butylphosphine (TBP), arsine ($AsH_3$), and dimethylzinc (DMZn) were used as an In source, a Ga source, a P source, an As source, and a Zn source serving as a dopant, respectively. Hydrogen was used as a carrier gas for each source. The liquid sources were filled in bubblers (not shown) where hydrogen was supplied to evaporate each gas. Each gas was supplied from a gas supply tube 13 into a chamber 11 through a mass-flow controller (MFC) 19 and a valve 18.

After a p-type GaAs substrate having a surface consisting of a (100) plane was mounted on the susceptor, $AsH_3$ and hydrogen were supplied to the chamber, and the substrate was heated to a temperature of 750° C. by an rf coil, thereby treating the surface of the substrate for 20 minutes. At this time, a total gas pressure was set to be 100 Torr, and an $AsH_3$ partial pressure was set to be 3 Torr. After the temperature of the GaAs substrate was reduced to 650° C., TMIn, TEG, TBP, DMZn, and hydrogen were supplied to the chamber to grow a Zn-doped InGaP film on the substrate. A total gas flow rate was set to be 2.4 l/min, and the pressure in the champer was set to be 100 Torr.

At this time,
a TMIn flow rate of 10.5 μmol/min,
a TEG flow rate of 8.7 μmol/min, and
a DMZn flow rate of 0.67 μmol/min,
were set to be constant. A ratio of a TBP flow rate to a III group source flow rate, i.e., [TBP]/[III group source] was changed within a range of 10 to 200. More specifically, the TBP flow rate was changed within a range of 192 μmol/min to 3,840 μmol/min. In this case, the "III group source" means the sum of TMIn and TEG.

The lattice mismatch (Δa/a) of the grown Zn-doped InGaP with respect to the GaAs substrate was within ±0.2%.

The dependency of the PL peak intensity of the resultant Zn-doped InGaP crystal layer on the ratio of [TBP]/[III group source] was measured. The PL peak intensity served as a measure of crystallinity. The PL measurement was performed at a temperature of 77K while an Ar ion laser was irradiated. A result obtained by this measurement is shown in FIG. 8.

Figure 8:
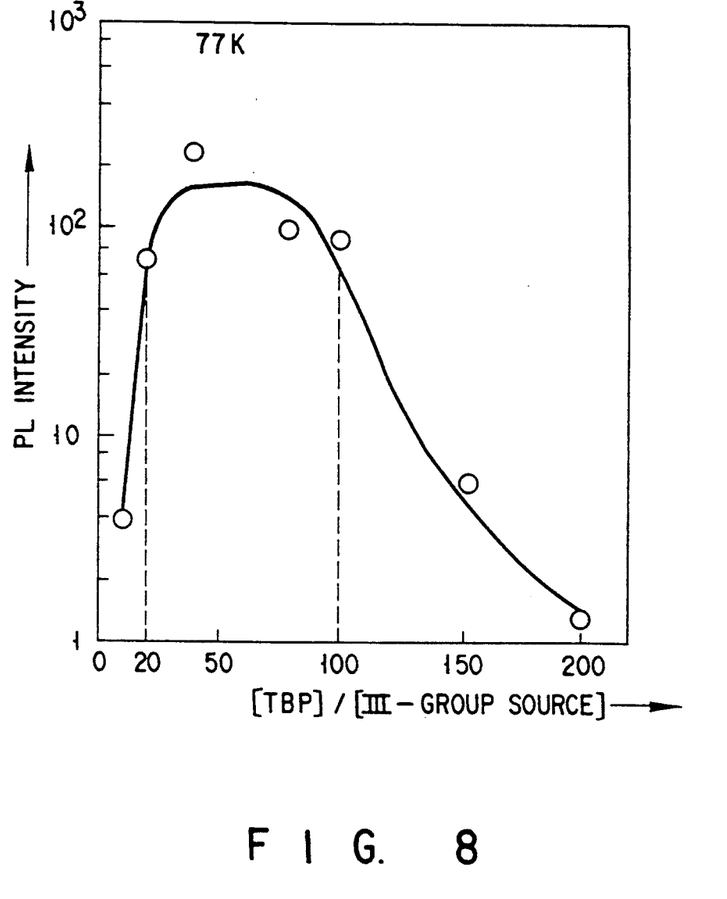
FIG. 8 is a graph showing a relationship between a PL intensity of a p-type InGaP thin film and a ratio of [TBP]/[III group source].

According to the graph in FIG. 8, when the ratio of the flow rates is lower than 20, the PL peak intensity is sharply decreased because the ratio is excessively decreased to generate a large number of phosphorus vacancies in the crystal. In addition, even when the ratio is higher than 100, the PL peak intensity is decreased. It is understood that the phenomenon occurs because a crystal growth reaction is inhibited by an increase in gas-phase intermediate reaction between TBP and DMZn or between TBP and a III group source, or an excessive generation of $P_2$ and $P_4$ molecules. Note that a carrier concentration measured by a C-V measurement was constantly 2 to $4 \times 10^{17}$ cm$^{-3}$ when the [TBP]/[III group source] ratio was set to be 10 to 100, and the carrier concentration was $1 \times 10^{17}$ cm$^{-3}$ or less when the [TBP]/[III group source] was set to be 150 or more. Therefore, in order to obtain a high-quality crystal layer, the TBP flow rate must be set to be 20 to 100 times to the III group source flow rate. However, under the growth conditions described in this example, when the ratio of the flow rates is set within a range of 20 to 80, the most desirable result can be obtained.

Further, a p- or n-type InGaAlP cladding layer was grown on an InGaP active layer at a [TBP]/[III group source] ratio of 40 to manufacture a semiconductor laser. When the life characteristics of this laser was evaluated, the same characteristics could be obtained as those of the laser manufactured by using $PH_3$ as a V group source.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a III-V group compound semiconductor in which a III group source and a V group source are decomposed to grow the III-V group compound semiconductor on a substrate, wherein said V group source is a compound represented by formula (1) given below:

Formula (1)

(1)

where X represents a V group element, n represents an integer from 1 to 3, and Y represents a group selected from the group consisting of a non-substituted amino group and an alkyl-substituted amino group bonded to the benzene ring at a position selected from the 2-, 4-, and 6-positions.

2. The method according to claim 1, wherein said III group source is an adduct of a III group hydride with an organic group coordinated to a III group element.

3. The method according to claim 1, wherein said III group source and said V group source are alternately supplied, said III group source being a compound selected from the group consisting of a III group compound having a phenyl group bonded to a III group element and a III group compound having an amine coordinated to a III group element.

4. The method according to claim 3, wherein said III group element is aluminum.

5. A method of manufacturing a III-V group compound semiconductor in which a III group source and a V group source are decomposed to grow the III-V group compound semiconductor on a substrate, wherein said V group source is a compound represented by formula (2) given below:

Formula (2)

(2)

where X represents a V group element, m represents an integer of 1 or 2, and Y represents a group selected from the group consisting of a non-substituted amino group and an alkyl-substituted amino group bonded to the cyclopentadiene ring at a position selected from the 2-, and 4-positions.

6. The method according to claim 5, wherein said III group source is an adduct of a III group hydride with an organic group coordinated to a III group element.

7. The method according to claim 5, wherein said III group source and said V group source are alternately supplied, said III group source being a compound selected from the group consisting of a III group compound having a phenyl group bonded to a III group element and a III group compound having an amine coordinated to a III group element.

8. The method according to claim 7, wherein said III group element is aluminum.

* * * * *